US009673260B2

(12) United States Patent
Oooka et al.

(10) Patent No.: US 9,673,260 B2
(45) Date of Patent: Jun. 6, 2017

(54) ORGANIC ELECTROLUMINESCENT DISPLAY DEVICE WITH AN UPPER ELECTRODE IN CONTACT WITH A LOWER ELECTRODE

(71) Applicant: Japan Display Inc., Tokyo (JP)

(72) Inventors: Hiroshi Oooka, Tokyo (JP); Hirotsugu Sakamoto, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/182,150

(22) Filed: Jun. 14, 2016

(65) Prior Publication Data

US 2016/0293677 A1    Oct. 6, 2016

Related U.S. Application Data

(62) Division of application No. 14/499,451, filed on Sep. 29, 2014, now Pat. No. 9,391,122.

(30) Foreign Application Priority Data

Sep. 30, 2013    (JP) .................................. 2013-202935

(51) Int. Cl.
*H01L 29/08* (2006.01)
*H01L 35/24* (2006.01)
(Continued)

(52) U.S. Cl.
CPC ........ *H01L 27/3213* (2013.01); *H01L 27/322* (2013.01); *H01L 27/3246* (2013.01);
(Continued)

(58) Field of Classification Search
CPC ............ H01L 27/3246; H01L 27/3276; H01L 2251/5315; H01L 27/3213; H01L 27/322;
(Continued)

(56) References Cited

U.S. PATENT DOCUMENTS

2003/0072890 A1*  4/2003  Miyazawa ............ C23C 14/042
                                                      427/554
2003/0146711 A1*  8/2003  Tsujimura ........... H01L 27/3246
                                                      315/169.3
(Continued)

FOREIGN PATENT DOCUMENTS

JP             2009-199868 A        9/2009

*Primary Examiner* — Thao X Le
*Assistant Examiner* — Nduka Ojeh
(74) *Attorney, Agent, or Firm* — Typhia IP LLC (57) ABSTRACT

In an organic EL display device, a resistance of a cathode electrode of OLEDs is substantially reduced while maintaining a higher opening ratio of pixels as an entire display area. A reference power supply line is formed on a glass substrate, and receives a reference potential for driving the OLED. The OLED is formed on the glass substrate where the reference power supply line is formed, and has a structure in which a lower electrode, an organic material layer, and an upper electrode that is a cathode electrode common to plural pixels are laminated on each other in the order from the bottom. In some of the plural pixels, a cathode contact that penetrates through the organic material layer, and electrically connects the upper electrode to the reference power supply line is formed within an opening area corresponding to a W sub-pixel.

10 Claims, 9 Drawing Sheets

(51) Int. Cl.
*H01L 51/00* (2006.01)
*H01L 27/32* (2006.01)
*H01L 51/52* (2006.01)

(52) U.S. Cl.
CPC ...... *H01L 27/3248* (2013.01); *H01L 27/3265* (2013.01); *H01L 27/3276* (2013.01); *H01L 51/5228* (2013.01); *H01L 2251/5315* (2013.01)

(58) Field of Classification Search
CPC ............. H01L 27/3265; H01L 51/5253; H01L 51/0545; H01L 51/0036; H01L 51/5012; H01L 27/3244
USPC ........ 257/40, 88, 98, 59, E51.022, E51.018; 438/34, 82, 99, 23, 46, FOR. 135, 438/FOR. 157, FOR. 287
See application file for complete search history.

(56) References Cited

U.S. PATENT DOCUMENTS

| | | |
|---|---|---|
| 2008/0084376 A1 | 4/2008 | Hirota et al. |
| 2012/0074834 A1 | 3/2012 | Kanegae |
| 2014/0042411 A1 | 2/2014 | Fukuzaki |

* cited by examiner

ORGANIC ELECTROLUMINESCENT DISPLAY DEVICE WITH AN UPPER ELECTRODE IN CONTACT WITH A LOWER ELECTRODE

CROSS-REFERENCE TO RELATED APPLICATION

This application is a divisional of U.S. patent application Ser. No. 14/499,451, filed on Sep. 29, 2014. Further, this application claims priority from Japanese application JP2013-202935 filed on Sep. 30, 2013, the entire contents of which is hereby incorporated by reference into this application.

BACKGROUND OF THE INVENTION

1. Field of the Invention

The present invention relates to an organic electroluminescent (EL) display device, and more particularly to a homogenization of a potential of an electrode common to plural pixels arrayed in a display area among electrodes of organic light emitting elements.

2. Description of the Prior Art(s)

Figure 7:
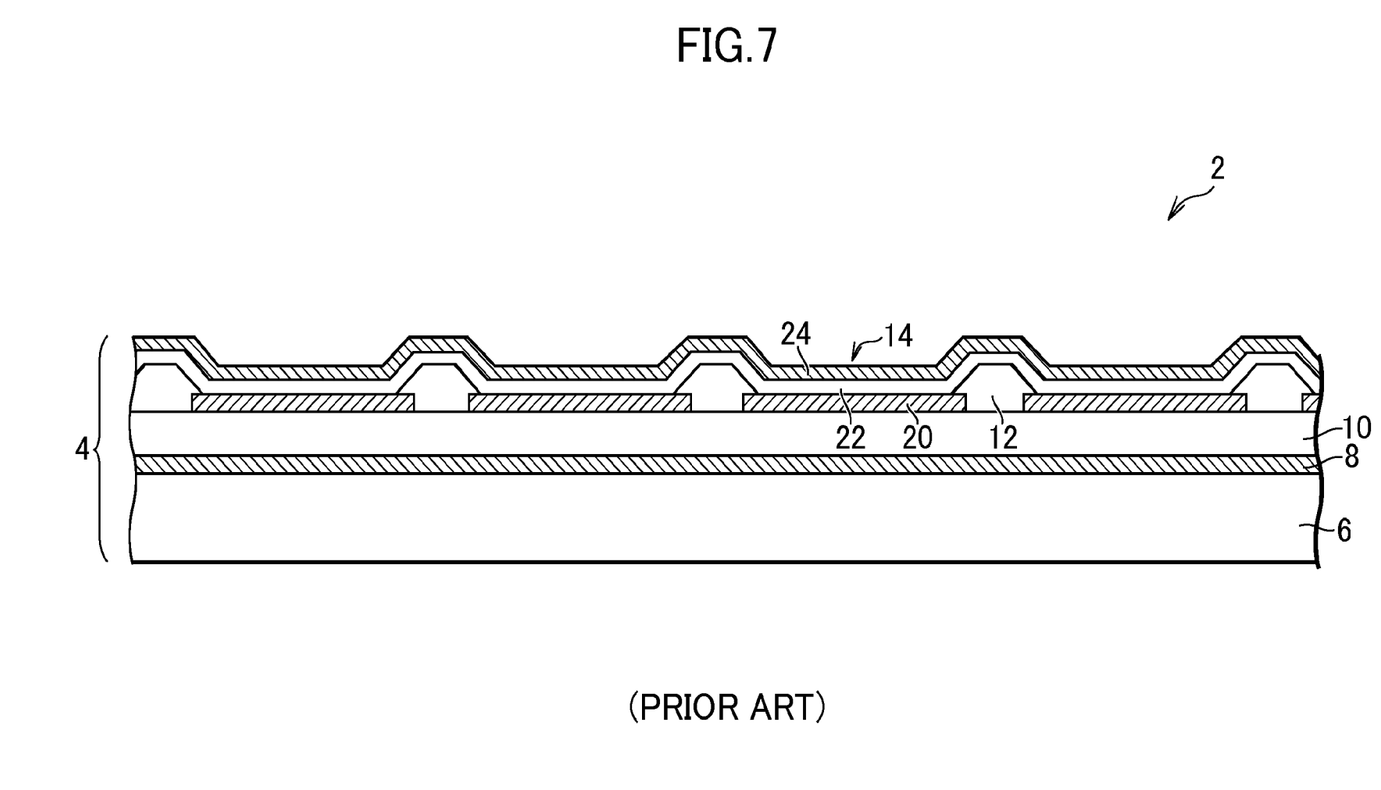
FIG. 7 is a schematic partial cross-sectional view of a display area of a TFT substrate in a related art organic EL display device.

The organic EL display device has a structure in which a TFT substrate is bonded to a counter substrate. FIG. 7 is a schematically partial cross-sectional view of a display area of a TFT substrate 4 in a related art organic EL display device 2, which illustrates a vertical cross-section along a horizontal direction of the display area. The TFT substrate 4 is configured, for example, so that a circuit layer 8, an insulating film 10, a bank 12, an organic light emitting diode (OLED) 14, and a sealing film 16 are laminated on a glass substrate 6.

Plural pixels are two-dimensionally arrayed in a display area. In an organic EL display device that conducts color display, each of the pixels includes plural sub-pixels that emit lights of different colors. For example, each of the pixels can be configured by an R sub-pixel that emits light of red (R), a G sub-pixel that emits light of green (G), and a B sub-pixel that emits light of blue (B). One pixel is also configured by four sub-pixels adding a W sub-pixel that emits light of white (W) to those sub-pixels.

The OLED 14 is formed in an opening area surrounded by the bank 12 (partition) for each sub-pixel, and includes a lower electrode 20, an organic layer 22 (organic material layer), and an upper electrode 24. The lower electrode 20 and the upper electrode 24 configure an anode electrode (anode) and a cathode electrode (cathode) of the OLED, respectively, and light emission in the organic layer 22 is controlled according to an electric signal applied between those electrodes. The upper electrode 24 is basically shared by the pixels in the overall display area, connected to a feeder line on an edge of the display area, and applied with a common voltage from a drive unit. On the other hand, the lower electrode 20 is formed for each of the pixels, and supplied with a current corresponding to a video signal from the drive unit through a pixel circuit of each pixel and a drive power supply line which are formed in the circuit layer 8.

The bank 12 functions as a partition for partitioning the OLED, particularly the organic layer 22 for each of the sub-pixels. Also, the bank 12 is formed of an insulating layer, and prevents short-circuiting between the respective lower electrodes 20 formed in every opening area.

The upper electrode 24 and the lower electrode 20 are made of a transparent conductive material such as IZO (indium zinc oxide) or ITO (indium tin oxide), for example.

In particular, in the organic EL display device of a top emission type, it is desirable that that transmittance of light in the upper electrode 24 is higher from the viewpoint of a reduction in the power consumption. In this example, if the transparent conductive material is thinned, the transmittance of the upper electrode 24 increases. On the other hand, the electric conductivity of the upper electrode 24 decreases, and a voltage drop caused by a current that flows in the OLED increases. Specifically, a potential difference between a position closer to the feeder line and a position farther from the feeder line in the upper electrode 24 becomes larger. As a result, shading (luminance gradient) in which a current density of the OLED decreases more to reduce the brightness more at a position farther from the feeder line occurs. That is, there arises such a problem that the light emission brightness does not become uniform, and display unevenness is generated within the display area. This problem becomes more remarkable as an area of a display panel is larger.

Under the circumstances, a configuration in which a feeder line that assists conduction is made of a material low in resistance value, and the upper electrode 24 and the feeder line are connected to each other through a contact hole formed in the bank 12 to substantially decrease the resistance of the upper electrode 24 has been proposed (JP 2009-199868 A).

Figure 8:
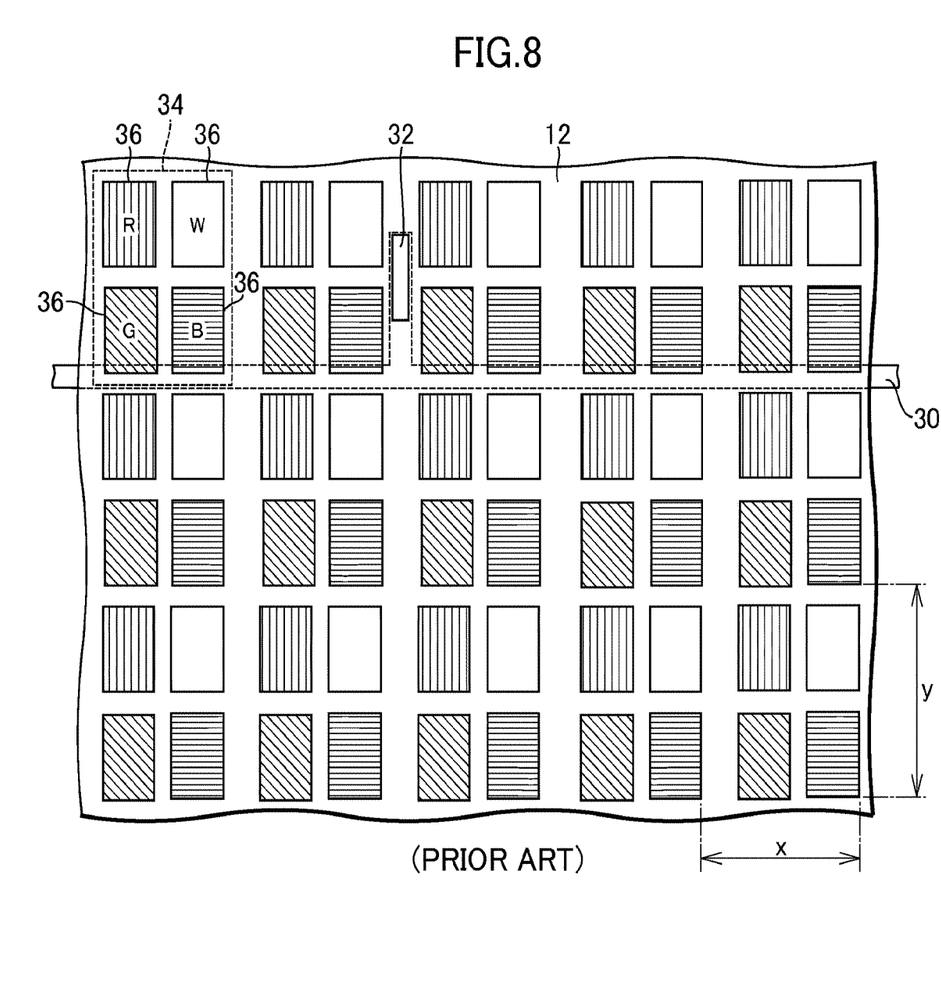
FIG. 8 is a plan view illustrating a part of a display area in the related art organic EL display device in which a contact hole that connects an upper electrode of an OLED to a feeder line is formed in a bank between adjacent pixels in a horizontal direction.
Figure 9:
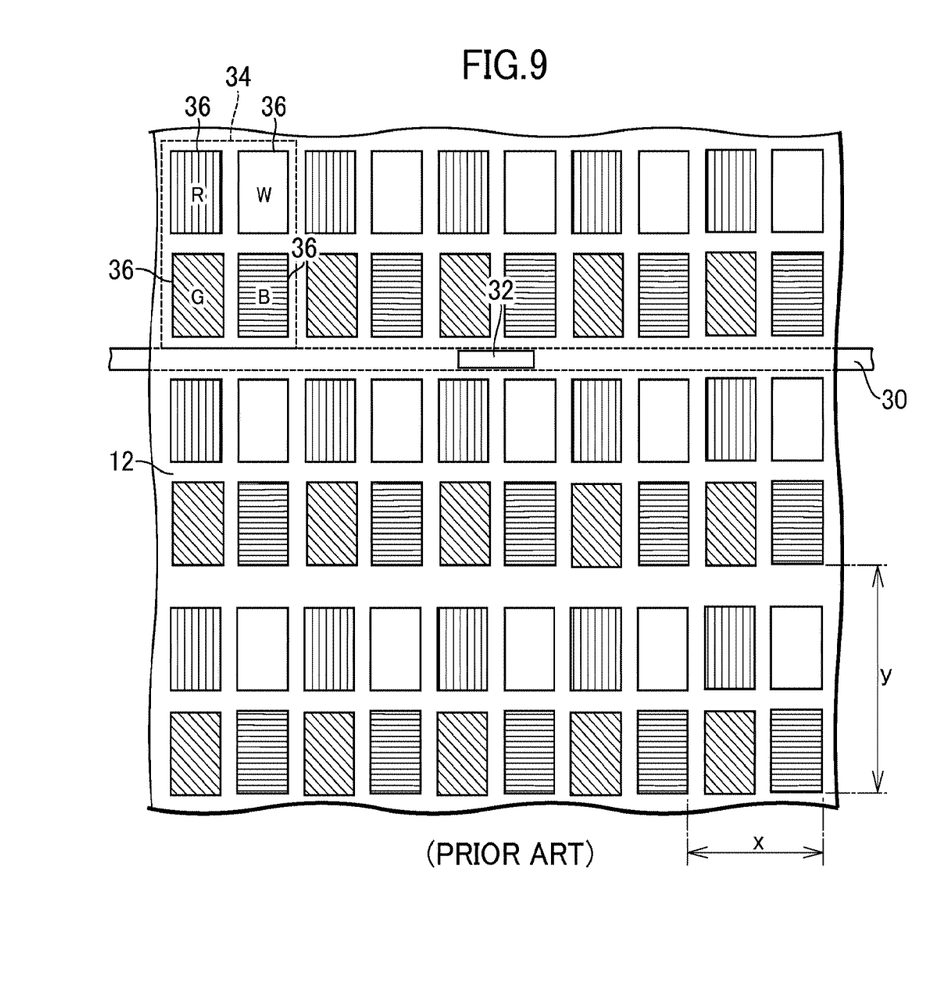
FIG. 9 is a plan view illustrating a part of a display area in the related art organic EL display device in which a contact hole that connects an upper electrode of an OLED to a feeder line is formed in a bank between adjacent pixels in a vertical direction.

FIGS. 8 and 9 are plan views of a part of a display area of the organic EL display device in which a contact hole 32 that connects the upper electrode 24 and a feeder line 30 is formed in the bank 12. In this example, each of pixels 34 includes four sub-pixels 36 of RGBW. FIG. 8 illustrates a case in which the contact hole 32 is arranged in the bank 12 between the pixels 34 adjacent to each other in a horizontal direction, and FIG. 9 illustrates a case in which the contact hole 32 is arranged in the bank 12 between the pixels 34 adjacent to each other in a vertical direction.

SUMMARY OF THE INVENTION

The bank 12 in which the contact hole 32 is arranged as illustrated in FIGS. 8 and 9 has a portion requiring a width larger than the bank in which the contact hole 32 is not arranged. That is, in the configuration where the contact hole 32 that connects the upper electrode 24 to the feeder line 30 is formed in the bank 12, a width of the bank 12 becomes larger than a size required for an original function of the bank 12, and the miniaturization of the bank 12 is limited. This leads to such a problem that the formation of the contact hole 32 is disadvantageous in the high definition of the organic EL display device.

Also, as illustrated in FIGS. 8 and 9, the contact hole 32 may not be always provided for each of the pixels depending on the conductivity of the upper electrode 24. However, in an image display device, since array pitches of the pixels are made uniform within the display area for the purpose of ensuring a display quality, the width and an area of the bank 12 at a position where the contact hole 32 does not need to be arranged from the viewpoint of electric characteristics are formed as large as those of the bank 12 at a position where the contact hole 32 is provided. As a result, an useless non-emitting area becomes large.

Specifically, when a pixel pitch in the horizontal direction is x, and a pixel pitch in the vertical direction is y in a pixel array of a matrix illustrated in FIGS. 8 and 9, x becomes larger than x when the contact hole 32 is not arranged in the bank 12 in the configuration illustrated in FIG. 8, and y becomes larger than y when the contact hole 32 is not arranged in the bank 12 in the configuration illustrated in FIG. 9. An increase in the pixel pitch is disadvantageous in higher definition, and the increase in the pixel pitch is caused by an increase in the width of the bank 12, which means an increase in the non-emitting area.

The present invention aims at providing an organic EL display device that suppresses shading, and obtains a high quality image while maintaining a high opening ratio of a pixel.

(1) According to the present invention, there is provided an organic EL display device in which a plurality of pixels each including at least one organic light emitting element formed in an opening area surrounded by a partition, and having a common shape are two-dimensionally arrayed, in which a feeder line is formed on a substrate, and receives a reference potential for driving the organic light emitting element, in which the organic light emitting element is formed on the substrate where the feeder line is formed, and has a structure in which a lower electrode, an organic material layer, and an upper electrode common to the plurality of pixels are laminated on each other in the order from the bottom, and in which some of the plurality of pixels are irregular pixels in which a perpendicular interconnection that penetrates through the organic material layer, and electrically connects the upper electrode to the feeder line is formed within the opening area.

(2) In the organic EL display device according to the above item (1), each of the pixels can include four of the opening areas that emit light of red, green, blue, and white, and in the irregular pixels, the perpendicular interconnection can be formed in all or a part of the opening area of the white light emission instead of the structure of the organic light emitting element.

(3) In the organic EL display device according to the above item (1), each of the pixels can include three of the opening areas that emit light of red, green, and blue, and in the irregular pixels, the perpendicular line can be formed in all or a part of the opening area of the blue light emission instead of the structure of the organic light emitting element.

(4) The configuration according to the above items (1) to (3) is suitable for the organic EL display device in which the upper electrode is formed of a transparent conductive film.

DETAILED DESCRIPTION OF THE INVENTION

Hereinafter, embodiments of the present invention will be described with reference to the accompanying drawings.

First Embodiment

Figure 1:
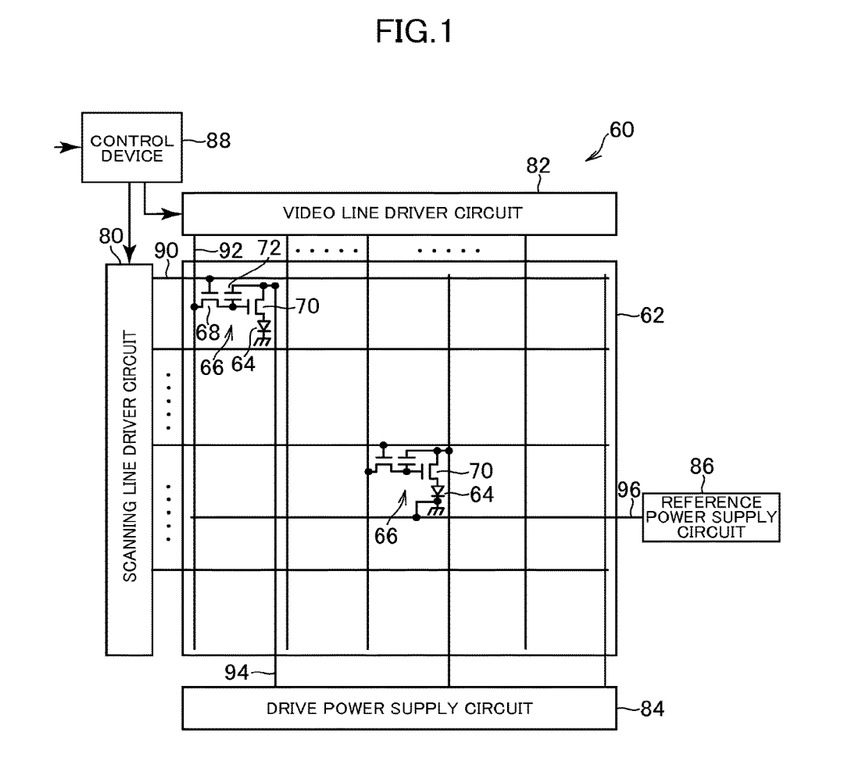
FIG. 1 is a schematic view illustrating a general configuration of an organic EL display device according to a first embodiment of the present invention.

An organic EL display device is an active matrix display device, and is incorporated into a television, a personal computer, a mobile terminal, and a cellular phone as a display panel. FIG. 1 is a schematic view illustrating a general configuration of an organic EL display device 60 according to a first embodiment of the present invention. The organic EL display device 60 includes a pixel array portion 62 which is a display area for displaying an image, and a drive portion that drives the pixel array portion 62.

In the pixel array portion 62, OLEDs 64 and pixel circuits 66 are arranged in a matrix in correspondence with pixels (or sub-pixels). Each of the pixel circuits 66 includes plural thin film transistors (TFT) 68, 70, and a capacitor 72. An anode electrode of each OLED 64 is connected to the drive TFT 70. Also, cathode electrodes of all the OLEDs 64 are configured by a common electrode as will be described later.

On the other hand, the drive portion includes a scanning line driver circuit 80, a video line driver circuit 82, a drive power supply circuit 84, a reference power supply circuit 86, and a control device 88. The drive portion drives the pixel circuits 66, and controls the light emission of the OLED 64.

The scanning line driver circuit 80 is connected to scanning lines 90 provided for each line (pixel row) of the pixels in the horizontal direction. The scanning line driver circuit 80 selects the scanning lines 90 according to a timing signal input from the control device 88 in order, and applies a voltage for turning on the lighting TFT 68 to the selected scanning line 90.

The video line driver circuit 82 is connected to video signal lines 92 provided for each line (pixel column) of the pixels in the vertical direction. The video line driver circuit 82 receives a video signal from the control device 88, and outputs a voltage corresponding to the video signal of the selected pixel row to each of the video signal lines 92 according to the selection of the scanning lines 90 by the scanning line driver circuit 80. The voltage is written in the capacitor 72 through the lighting TFT 68 on the selected pixel row. The drive TFT 70 supplies a current corresponding to the written voltage to the OLED 64 with the result that the OLED 64 of the pixel corresponding to the selected scanning line 90 emits light.

The control device 88 includes an arithmetic processing circuit such as a CPU (central processing unit), and a storage unit formed of a memory element such as an ROM (read only memory) or an RAM (random access memory). The control device 88 receives the video signal. For example, when the organic EL display device 60 configures a display portion of a computer or a mobile terminal, the video signal is input to the organic EL display device 60 from a computer of a main body. Also, when the organic EL display device 60 configures a television receiver, the video signal is received by an antenna or a tuner not shown. The control device 88 executes various processing by allowing the CPU to read and execute a program stored in the memory. Specifically, the control device 88 conducts various image signal processing such as color tuning on the video signal, and outputs the video signal to the video line driver circuit 82. Also, the control device 88 generates a timing signal for synchronizing the scanning line driver circuit 80 or the video line driver circuit 82 on the basis of the input video signal, and outputs the timing signal toward those circuits.

The drive power supply circuit 84 is connected to a drive power supply line 94 disposed for each of the pixel columns, and supplies a current to the OLED 64 through the drive power supply line 94 and the drive TFT 70 of the selected pixel row.

The reference power supply circuit 86 gives a reference potential to a common electrode (not shown) configuring the cathode electrodes of the OLEDs 64, and a reference power supply line 96. The reference potential can be set to a ground potential.

The reference power supply line 96 (feeder line) is arranged across the pixel array portion 62, and connected to the cathode electrode of some OLEDs 64 within the pixel array portion 62. In order to reduce a wiring resistance from the reference power supply circuit 86 to the cathode electrode of the OLED 64, it is preferable that the reference power supply line 96 extends along short sides of the pixel array portion 62. In this embodiment, the pixel array portion 62 is a vertically long rectangular, and the reference power supply line 96 is arranged in the horizontal direction in correspondence with the configuration of the pixel array portion 62. FIG. 1 illustrates a configuration in which one reference power supply line 96 is arranged in the pixel array portion 62, and connected to one OLED 64 as an example of the configuration in which the reference power supply line 96 is connected to only a part of the OLEDs 64 as described above. Both ends of the reference power supply line 96 can be connected to the reference power supply circuit 86. However, in FIG. 1, for convenience of illustration, only one end of the reference power supply line 96 is connected to the reference power supply circuit 86.

Figure 2:
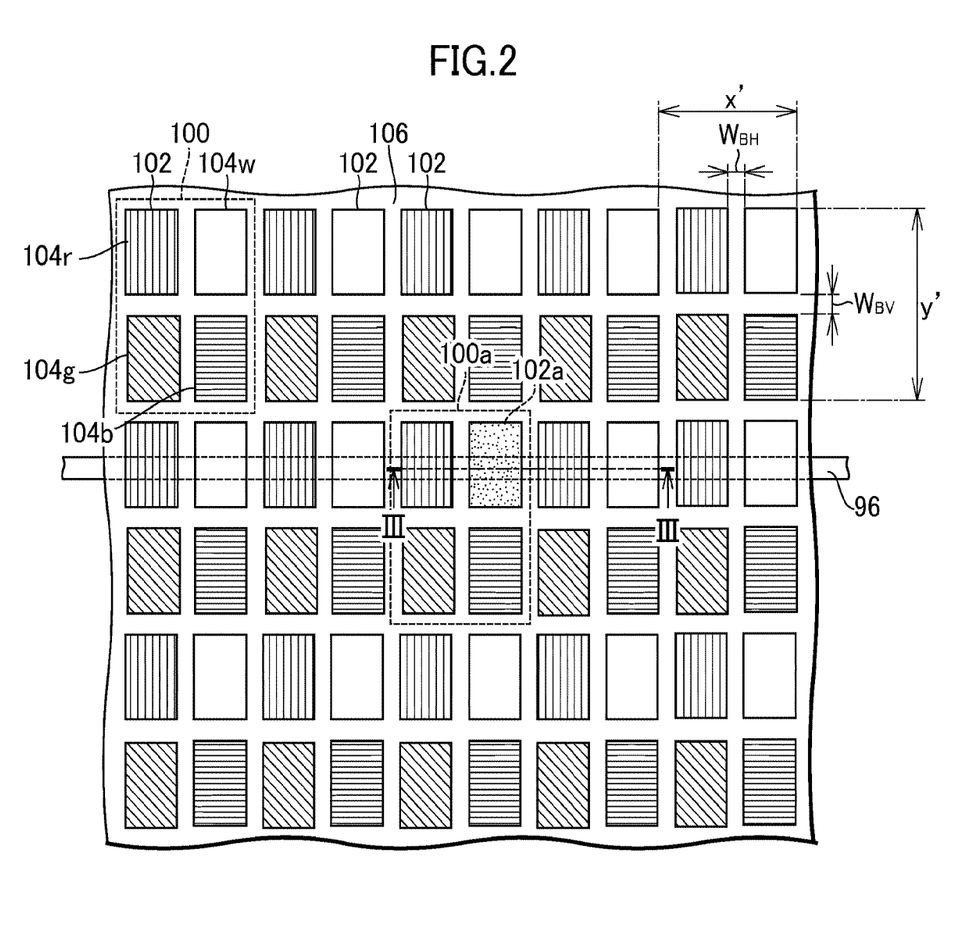
FIG. 2 is a schematic partial plan view of a pixel array portion of the organic EL display device according to the first embodiment of the present invention.

The supply of the reference potential to the cathode electrode of the OLED 64 with the use of the reference power supply line 96 will be described in more detail. FIG. 2 is a schematic partial plan view of the pixel array portion 62 of the organic EL display device 60. Each of pixels 100 includes four sub-pixels of RGBW which are Bayer-arrayed. Specifically, four opening areas 102 aligned two by two in the horizontal direction and the vertical direction correspond to the four sub-pixels 104. An R sub-pixel 104r and a B sub-pixel 104b are arranged on one diagonal line of a rectangle formed by the four opening areas, and a G sub-pixel 104g and a W sub-pixel 104w are arranged on another diagonal line thereof. In this embodiment, the respective opening areas 102 are designed with the identical shape and size.

One OLED 64 is formed in each of the opening areas 102 formed in the insulating layer. In this example, four kinds of light emission colors different in each of the sub-pixels 104 are obtained by forming four kinds of OLEDs 64 that emit light of different colors, or combining the OLED 64 that emits light of, for example, white, and a color filter.

A bank 106 is formed around each of the opening areas 102. That is, the bank 106 partitions the respective opening areas 102 adjacent to each other in the horizontal direction, and partitions the respective opening areas 102 adjacent to each other in the vertical direction. Also, the bank 106 is formed of an insulating layer, and covers an edge of the lower electrode formed in each of the pixels to prevent short-circuiting between the lower electrode and the upper electrode. A width of the bank 106 can be set to a size sufficient to perform a function of the bank as a partition for separating and forming the OLEDs 64, and does not require a size as large as the contact hole can be formed as described in the related art. A width $W_{BH}$ of a portion in the bank 106 which partitions the respective opening areas 102 aligned in the horizontal direction, and a width $W_{BV}$ of a portion in the bank 106 which partitions the respective opening areas 102 aligned in the vertical direction can be made identical with each other between the respective arbitrary opening areas 102. Also, the width $W_{BH}$ and the width $W_{BV}$ can be basically set to the same value.

The above-mentioned pixels 100 are basic pixels in the pixel array portion 62, and at least majority of the pixels configuring the pixel array portion 62 includes the basic pixels 100. On the other hand, some pixels of the pixel array portion 62 are configured by irregular pixels 100a having a structure in which the basic pixel 100 are changed. In each of the irregular pixels 100a, a perpendicular interconnection (cathode contact) is formed in an opening area within the irregular pixel 100a. The perpendicular interconnection penetrates through the organic material layer configuring the OLED 64 and electrically connects the cathode electrode, which is the upper electrode, and the reference power supply line 96. In the irregular pixel 100a according to this embodiment, a cathode contact is formed in an opening area 102a corresponding to the W sub-pixel 104w in the basic pixel 100 instead of the structure of the organic light emitting element. The other configurations of the irregular pixel 100a are identical with those of the basic pixels 100. Hence, pixel pitches x' in the horizontal direction, and pixel pitches y' in the vertical direction are uniform in the pixel array portion 62.

Figure 3:
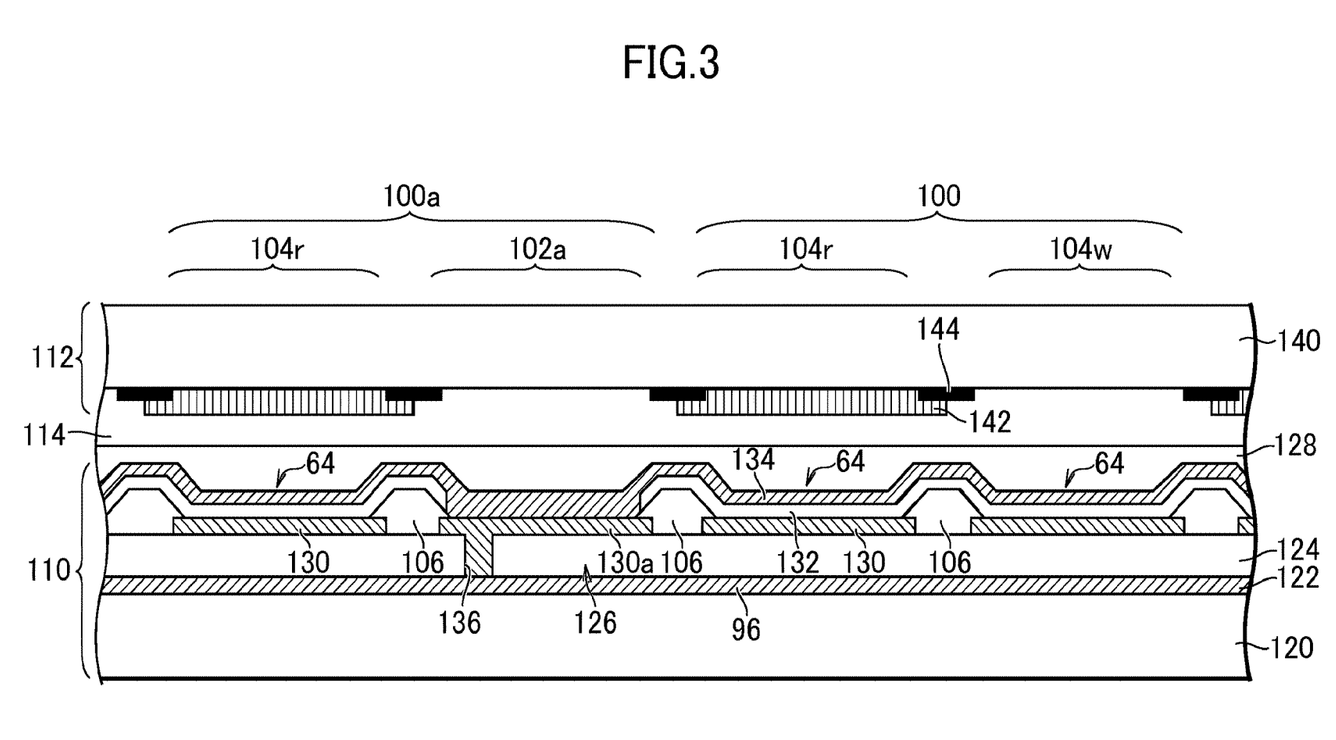
FIG. 3 is a schematic partial cross-sectional view of the pixel array portion of the organic EL display device according to the first embodiment of the present invention.

FIG. 3 is a schematic partial cross-sectional view of the pixel array portion 62 of the organic EL display device 60, which illustrates a vertical cross-section of the pixel array portion taken along a line in the horizontal direction illustrated in FIG. 2. The organic EL display device 60 has a structure in which a TFT substrate 110 and a counter substrate 112 are bonded with each other with a filler layer 114 sandwiched therebetween. In this embodiment, the pixel array portion is of a top emission type, the OLED 64 that is a light emitting portion is formed on the TFT substrate 110, and a light generated by the OLED is emitted from the counter substrate 112. That is, in FIG. 3, the light of the OLED is emitted upward. Also, a coloring system in the organic EL display device 60 illustrated in FIG. 3 is a color filter system in which a white light is generated by the OLED, and the white light passes through the color filter to obtain the respective colors of RGB. In the W sub-pixel 104w, no color filter is arranged, and the white light of the OLED is extracted as it is.

In the TFT substrate 110, for example, a circuit layer 122, an insulating film 124, the bank 106, the OLED 64, a cathode contact 126, and a sealing film 128 are laminated on a glass substrate 120.

The circuit layer 122 includes the pixel circuits 66, the scanning lines 90, the video signal lines 92, the drive power supply line 94, and the reference power supply line 96 as described above, and is formed on a surface of the glass substrate 120. FIG. 3 illustrates only the reference power supply line 96 in the circuit layer 122. Since the circuit layer 122 is located in the rear of the OLED 64 in the organic EL display device 60 of the top emission type when viewed from the counter substrate 112 side which is a display surface, the circuit layer 122 can be made of an opaque material. In particular, the various lines such as the reference power supply line 96 can be made of metal high in conductivity as compared with a transparent conductive material such as ITO (Indium Tin Oxide) or IZO (Indium Zinc Oxide), and decrease the resistance.

The OLED 64 has a structure in which a lower electrode 130, an organic material layer 132, and an upper electrode 134 are laminated on each other in order from the bottom. The organic material layer 132 includes a hole transport layer, a light emitting layer, and an electron transport layer.

In this embodiment, the lower electrode 130 and the upper electrode 134 configure the anode electrode and the cathode electrode of the OLED 64, respectively, and the light emission in the light emitting layer is controlled according to an electric signal applied between the lower electrode 130 and the upper electrode 134.

The lower electrodes 130 are separated for each of the pixels. The lower electrode 130 is made of ITO or IZO. The lower electrode 130 is electrically connected to the TFT (the drive TFT 70 illustrated in FIG. 1) formed in the circuit layer 122 through a contact hole (not shown), and supplied with a current corresponding to the video signal by the drive portion and the pixel circuit.

In this embodiment, the organic EL display device 60 is of the top emission type, and the lower electrode 130 can have a double-layer structure in which a transparent conductive film is laminated on a reflective layer made of a material high in optical reflectivity. For example, the reflective layer can be made of aluminum (Al) or silver (Ag), and reflects the light from the light emitting layer to the display surface, that is, the counter substrate 112 side.

The upper electrode 134 is a common electrode that is basically continuously formed over the pixels of the overall pixel array portion 62. The upper electrode 134 is made of a transparent electrode material such as ITO or IZO.

An end of the upper electrode 134 is connected to the reference power supply circuit 86 illustrated in FIG. 1 through the line, and applied with a reference potential from the reference power supply circuit 86.

Further, the upper electrode 134 is connected to the reference power supply line 96 by the cathode contact 126 formed in the opening area 102a located at a position corresponding to the W sub-pixel in the pixel 100, in the irregular pixel 100a, and applied with a reference potential from the reference power supply circuit 86 through the reference power supply line 96. As described above, the reference power supply line 96 is made of metal and can decrease the resistance, and a voltage drop between the reference power supply circuit 86 and the cathode contact 126 due to the reference power supply line 96 is smaller than a voltage drop in the upper electrode 134. Under the circumstances, the irregular pixel 100a is arranged so that the uniformity of the potential of the upper electrode 134 in the pixel array portion 62 is improved by the application of the reference potential through the cathode contact 126, and the shading of the brightness of the OLED 64 is suppressed.

As described above, with the use of the cathode contact 126 and the reference power supply line 96, even if the upper electrode 134 is thinned, the shading can be suppressed. Hence, since the upper electrode 134 can be thinned to improve the transmittance of the upper electrode 134, a drive electric power of the OLED 64 for obtaining a desired display brightness can be reduced.

The cathode contact 126 is made of a conductive material filled in a contact hole 136 that penetrates through the insulating film 124, a lower electrode 130a, and a conductive material of the upper electrode 134 filled in a hole that penetrates through the organic material layer 132.

The sealing film 128 is laminated on the overall surface of the pixel array portion 62 where the OLEDs 64 are formed. The sealing film 128 has a function of blocking the transmission of moisture contained in the filler layer 114 to protect the OLEDs 64.

The counter substrate 112 has a structure in which a color filter 142 is laminated on a transparent substrate such as a glass substrate 140. For example, in the cross-section illustrated in FIG. 3, the color filter 142 that transmits through a wavelength region of red is arranged at a position of the R sub-pixel 104r. As has already been described, no color filter 142 is arranged in the W sub-pixel 104w. A black matrix 144 is arranged in a boundary of the color filter 142.

Figure 4A:
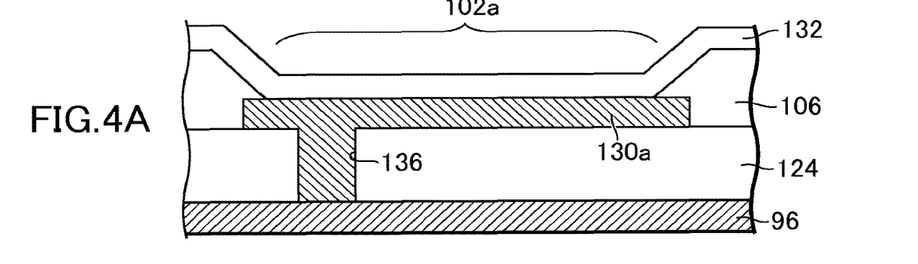
FIGS. 4A to 4C are schematic vertical cross-sectional views of main steps in a process for forming a cathode contact.
Figure 4B:
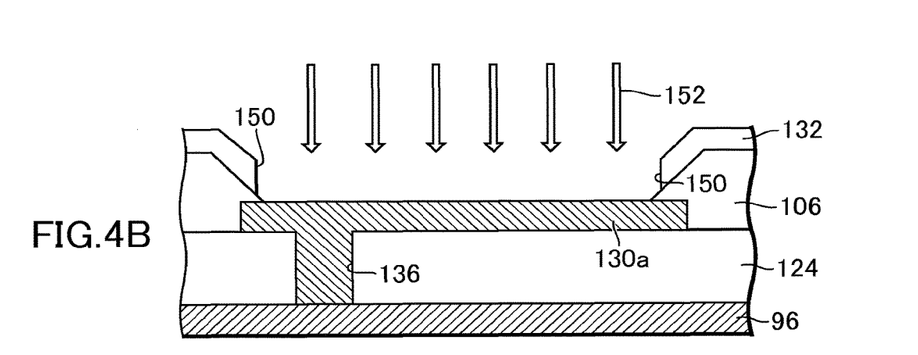
Figure 4C:
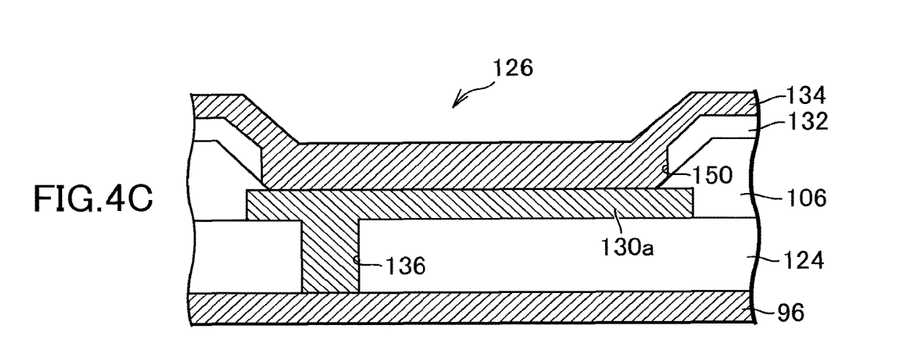

FIGS. 4A to 4C illustrate a schematic process flow illustrating a method of forming the cathode contact 126, and FIGS. 4A to 4C are respective schematic vertical cross-sectional views of main manufacturing steps in a portion related to the cathode contact 126 in the opening area 102a of the irregular pixel 100a of FIG. 3.

FIG. 4A illustrates a state in which the circuit layer 122, the insulating film 124, the lower electrode 130, the bank 106, and the organic material layer 132 are sequentially formed over the glass substrate 120. The formation of those respective layers can be basically conducted in the same manner as the normal opening areas 102 where the OLEDs 64 are formed, or the related art. In the opening area 102a, the reference power supply line 96 is arranged below the lower electrode 130a as the circuit layer 122, and the contact hole 136 is formed above the reference power supply line 96 in the insulating film 124. Incidentally, in the normal opening area 102, the contact hole for connecting the lower electrode 130 to the drive TFT 70 is formed in the insulating film 124, and instead, the contact hole 136 is formed in the opening area 102a. The contact hole in the normal opening area and the contact hole 136 in the opening area 102a can be formed in the same step. The contact hole 136 is filled with a conductive material.

After the contact hole 136 has been formed in the insulating film 124, a conductive film forming the lower electrode 130 is laminated on the surface of the insulating film 124, and patterned through the photolithography to form the lower electrode 130a separated from the lower electrode 130 of the adjacent opening area 102. Incidentally, the filling of the above contact hole 136 with the conductive material can be conducted in the step of laminating the conductive material forming the lower electrode 130a. That is, the conductive material forming the lower electrode 130a is formed on the surface of the insulating film 124 and also filled in the contact hole 136 to electrically connect between the reference power supply line 96 and the lower electrode 130a.

After the formation of the lower electrode 130a, the bank 106 is formed, and the organic material layer 132 is laminated. FIG. 4A illustrates a state in which the above step has been completed.

Then, a through-hole 150 is opened in the organic material layer 132 of the opening area 102a (FIG. 4B). The through-hole 150 can be formed by, for example, removing the organic material layer 132 with the irradiation of a laser beam 152. After the formation of the through-hole 150, the conductive film is laminated to form the upper electrode 134 (FIG. 4C). The conductive film of the upper electrode 134 is filled in the through-hole 150, and electrically connected to the lower electrode 130*a* that is exposed from a bottom of the through-hole 150. With the above configuration, as perpendicular interconnection that penetrates through the organic material layer 132 and electrically connects the upper electrode 134 and the reference power supply line 96, the cathode contact 126 is formed in the opening area 102*a*.

When the organic material layer 132 is painted for each of the opening areas 102 through the ink jet system, the organic material layer 132 is not formed in the opening area 102*a* of the irregular pixel 100*a* in advance, as a result of which the removal step can be omitted. Also, when the organic material layer 132 is formed by vapor deposition, the opening area 102*a* can be put into an area in which the organic material layer 132 is not formed with the use of a fine metal mask.

In the above-mentioned organic EL display device 60, a part of the pixels that are two-dimensionally arrayed in the pixel array portion 62 is the irregular pixel 100*a*. A position of the irregular pixel 100*a* in the pixel array portion 62 is stored in a memory of the control device 88 in advance. The control device 88 generates a signal representing a brightness value of the sub-pixels 104 in each of the pixels on the basis of the input video signal, and outputs the signal to the video line driver circuit 82. In this situation, the control device 88 determines whether the pixel represented by the input video signal is the basic pixels 100 or the irregular pixel 100*a*, with reference to information on the position of the irregular pixel 100*a* stored in the memory. Then, the control device 88 converts the video signal corresponding to the position of the basic pixel 100 into four kinds of color component signals of RGBW, and also converts the video signal corresponding to the position of the irregular pixel 100*a* into three kinds of color component signals of RGB. In the conversion, the intensity of the respective component signals of RGBW is determined so that the color and the brightness represented by the input video signal are represented by the composition of the light emission of RGBW colors in the basic pixel 100. In the irregular pixel 100*a*, the intensity of the respective component signals of RGB is determined so that the color and the brightness are represented by the composition of the light emission of RGB colors. As a result, the same display characteristic is basically realized between the pixels 100 and the irregular pixels 100*a*.

Second Embodiment

A description will be given of the organic EL display device 60 according to a second embodiment of the present invention below. In this embodiment, the components common to those in the first embodiment are denoted by identical symbols, and a description of those components will be basically omitted, and differences from the first embodiment will be mainly described.

Figure 5:
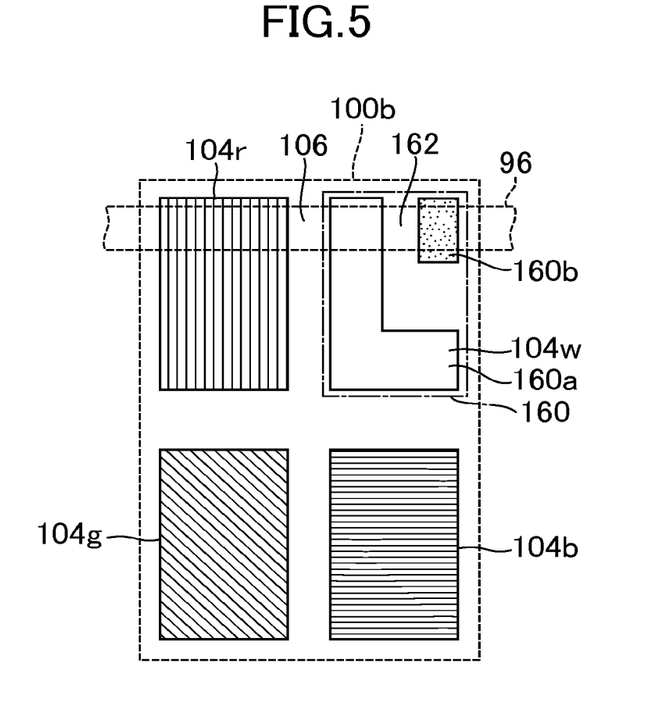
FIG. 5 is a schematic plan view of an irregular pixel in an organic EL display device according to a second embodiment of the present invention.

Each of the pixels 100 according the second embodiment includes four sub-pixels of RGBW which are Bayer-arrayed as in the first embodiment. Differences between the second embodiment and the first embodiment reside in the structure of the irregular pixel. FIG. 5 is a schematic plan view of an irregular pixel 100*b* according to the second embodiment. In the irregular pixel 100*h*, the cathode contact 126 is formed in a part of an area 160 corresponding to an opening area of the W sub-pixel 104*w* of each basic pixel 100 instead of the structure of the organic light emitting element. Specifically, the area 160 is partitioned into two areas 160*a* and 160*b* by a bank 162, and the OLED 64 of the white light emission is formed, for example, in the area 160*a* as with the basic pixel 100. On the other hand, the cathode contact 126 is formed in the area 160*b* without provision of the organic material layer 132.

In this embodiment, the control device 88 converts the video signal corresponding to the position of the irregular pixel 100*b* into four kinds of the color component signals of RGBW. In this situation, that an area of the W sub-pixel 104*w* in the irregular pixel 100*b* is smaller than the basis pixel 100 is taken into consideration. For example, the brightness reduction corresponding to a reduction of the area of the W sub-pixel 104*w* can be compensated by increasing the light emission intensity of the RGB sub-pixels 104, or can be compensated by increasing a current density of the OLED in the W sub-pixel 104*w*.

Third Embodiment

A description will be given of the organic EL display device 60 according a third embodiment of the present invention. In this embodiment, the components common to those in the first embodiment are denoted by identical symbols, and a description of those components will be basically omitted, and differences from the first embodiment will be mainly described.

Figure 6:
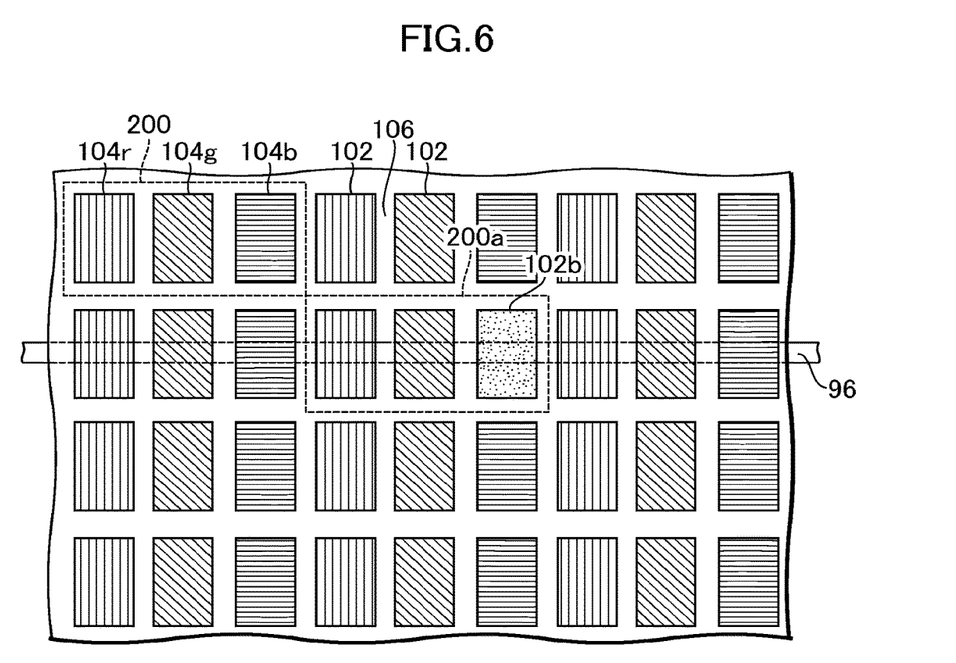
FIG. 6 is a schematic partial plan view of a pixel array portion in an organic EL display device according to a third embodiment of the present invention.

FIG. 6 is a schematic partial plan view of a pixel array portion 62 in an organic EL display device 60 according to this embodiment. This embodiment is different from the first embodiment in that a basic pixel 200 includes three sub-pixels of RGB, and the cathode contact 126 is formed in an opening area 102*b* located at a position in an irregular pixel 200*a* corresponding to the B sub-pixel in the basic pixel 200.

In this embodiment, the irregular pixel 200*a* includes two sub-pixels of RG. For that reason, a deficit of the B sub-pixel caused by the provision of the cathode contact 126 cannot be compensated by signal processing. However, since B is a color lowest in the visual sensitivity among RGB, a configuration in which the B sub-pixel forms the formation area of the cathode contact 126 hardly deteriorates the image quality. In particular, if the number of irregular pixels 200*a* is very small in the pixel array portion 62, the image quality deterioration is not noticeable. On the other hand, with the provision of the cathode contact 126, as in the first and second embodiments, the shading is suppressed, and the power consumption in the OLED can be reduced.

In the above respective embodiments, the organic EL display device 60 is of the top emission type. However, the present invention intended to substantially reduce the resistance of the upper electrode 134 using the reference power supply line 96 and the cathode contact 126 can be also applied to the organic EL display device 60 of a bottom emission type. For example, in a large-area display device, with the application of the configuration of the present invention, the shading can be further preferably suppressed as compared with a case in which the upper electrode 134 is merely thickened to reduce the resistance.

According to the above-mentioned present invention using the embodiments, the upper electrode is connected to the feeder line within the display area, thereby being capable of suppressing shading. Since the connection between the upper electrode and the feeder line is conducted by the opening areas of some pixels, there is no need to increase the width of the bank, the high opening ratio of the pixel can be maintained from the viewpoint of the overall display area, and the resolution is improved.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic electroluminescent display device comprising:
   a substrate;
   a plurality of pixels formed on the substrate, each of the pixels including a lower electrode, a light emitting layer, and an upper electrode;
   a bank partitioning the pixels and exposing the lower electrode;
   a line formed on the substrate and under the lower electrode; and
   an insulating film located between the line and the lower electrode,
   wherein at least one of the pixels has a hole which penetrates through the light emitting layer and exposes the lower electrode, the hole being located where the lower electrode is exposed by the bank,
   the insulating film has a contact hole which is different from the hole and overlaps the hole in plan view,
   the lower electrode is on and in physical contact with the line at the contact hole,
   the hole does not project into the insulating film,
   the upper electrode is on and in physical contact with the lower electrode at the hole,
   the upper electrode is electrically connected to the line via the lower electrode at the hole, and
   the at least one of the pixels has a first sub pixel which includes a light emitting area and a second sub pixel which includes a non-emitting area corresponding to the hole and does not include a light emitting area.

2. The organic electroluminescent display device according to claim 1, wherein the line supplies the upper electrode with a common voltage.

3. The organic electroluminescent display device according to claim 1, wherein the upper electrode is common to the plurality of pixels.

4. The organic electroluminescent display device according to claim 1, wherein the bank has a first opening which exposes the light emitting area and a second opening which exposes the non-emitting area in one of the pixels.

5. The organic electroluminescent display device according to claim 1, wherein the plurality of pixels includes basic pixels and irregular pixels,
   each of the irregular pixels has the first sub pixel and the second sub pixel,
   the first sub pixel includes the hole, and
   each of the basic pixels does not include the hole.

6. The organic electroluminescent display device according to claim 1, wherein
   the lower electrode has an exposed region which is exposed by the hole,
   the light emitting layer has an end region corresponding to an outer periphery of the hole,
   the bank has a side surface surrounding the exposed region, and
   the end region is located on the side surface.

7. An organic electroluminescent display device comprising:
   a substrate;
   a plurality of pixels formed on the substrate and arranged in a matrix, each of the pixels including a lower electrode, a light emitting layer, and an upper electrode which is common to the plurality of pixels;
   a bank partitioning the pixels and exposing the lower electrode;
   a line formed on the substrate and under the lower electrode, and supplying the upper electrode with a common voltage; and
   an insulating film located between the line and the lower electrode,
   wherein the pixels include first pixels and second pixels,
   each of the first pixels emit light where the lower electrode is exposed by the bank,
   each of the second pixels have a hole which penetrates through the light emitting layer and does not project into the insulating film, the hole being located where the lower electrode is exposed by the bank,
   the upper electrode is on and in physical contact with the lower electrode at the hole in each of the second pixels,
   the upper electrode is electrically connected to the line via the lower electrode at the hole in each of the second pixels,
   the plurality of pixels includes basic pixels and irregular pixels,
   each of the irregular pixels has a first sub pixel and at least one second sub pixel,
   the first sub pixel includes the hole,
   the second sub pixel does not include the hole, and
   each of the basic pixels does not include the hole.

8. The organic electroluminescent display device according to claim 7, wherein a plurality of lines including the line are formed on the substrate and under the lower electrode, and supply the upper electrode with a common voltage,
   the plurality of lines extends in a first direction, and arranged in a second direction,
   each of the lines overlaps some of the pixels arranged in the first direction, and
   the overlapped pixels include at least one of the second pixels.

9. The organic electroluminescent display device according to claim 7, wherein the insulating film has a contact hole which is different from the hole and overlaps the hole in plan view, and
   the lower electrode is on and in physical contact with the line at the contact hole.

10. The organic electroluminescent display device according to claim 7, wherein
    the lower electrode has an exposed region which is exposed by the hole,
    the light emitting layer has an end region corresponding to an outer periphery of the hole,
    the bank has a side surface surrounding the exposed region, and
    the end region is located on the side surface.

* * * * *